(12) United States Patent
Kashima et al.

(10) Patent No.: US 11,646,731 B2
(45) Date of Patent: May 9, 2023

(54) SEMICONDUCTOR DEVICE

(71) Applicant: RENESAS ELECTRONICS CORPORATION, Tokyo (JP)

(72) Inventors: Issei Kashima, Tokyo (JP); Atsushi Tsuda, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 17/560,671

(22) Filed: Dec. 23, 2021

(65) Prior Publication Data
US 2022/0216866 A1 Jul. 7, 2022

(30) Foreign Application Priority Data
Jan. 6, 2021 (JP) .............................. JP2021-000625

(51) Int. Cl.
*H03K 17/22* (2006.01)
*H03K 5/24* (2006.01)
*H03K 17/60* (2006.01)
*H03K 17/687* (2006.01)

(52) U.S. Cl.
CPC ............. *H03K 17/22* (2013.01); *H03K 5/24* (2013.01); *H03K 17/60* (2013.01); *H03K 17/687* (2013.01)

(58) Field of Classification Search
CPC ................................. H03K 5/24; H03K 17/22
USPC ................................................ 327/142, 143
See application file for complete search history.

(56) References Cited

U.S. PATENT DOCUMENTS

| 8,593,887 | B2 | 11/2013 | Nakanishi et al. | |
|---|---|---|---|---|
| 2007/0046341 | A1* | 3/2007 | Tanzawa | H03K 17/14 327/143 |
| 2009/0219066 | A1* | 9/2009 | Shkidt | H03K 17/22 327/143 |
| 2012/0212194 | A1* | 8/2012 | Tachibana | G05F 3/30 323/268 |
| 2015/0042386 | A1* | 2/2015 | Bhowmik | H03K 17/223 327/143 |
| 2015/0286236 | A1* | 10/2015 | Dornseifer | H03K 5/24 323/313 |

FOREIGN PATENT DOCUMENTS

| FR | 2 844 118 A1 | 3/2004 |
|---|---|---|
| JP | 2012-048349 A | 3/2012 |
| WO | 2020/165250 A1 | 8/2020 |

OTHER PUBLICATIONS

Extended European Search Report issued in corresponding European Patent Application No. 22150320.4-1211, dated May 19, 2022.
P. Pandey, "Low-voltage power-on-reset circuit with least delay and high accuracy", Electronics Letter, vol. 51, No. 11, May 28, 2015, pp. 856-858.

* cited by examiner

*Primary Examiner* — William Hernandez
(74) *Attorney, Agent, or Firm* — McDermott Will & Emery LLP

(57) ABSTRACT

To provide a technique for detecting a low voltage of a power-on reset circuit. A semiconductor device has a power-on reset circuit including: a first bipolar transistor; a second bipolar transistor formed by connecting a plurality of bipolar transistors in parallel; a detection-voltage adjusting resistance element; a temperature-characteristic adjusting resistance element; a current adjusting resistance element; and a comparator.

8 Claims, 12 Drawing Sheets

FIG. 4

$$I_1(I_3) = \frac{\Delta V_{BE}}{R_1} = \frac{k_b T}{q} \cdot \ln(N) \cdot \frac{1}{R_1} \quad \cdots\cdots(1)$$

$$I_2 = \frac{V_{BE1}}{R_2} \quad \cdots\cdots(2)$$

$$V_{por} = (2 \cdot I_1 + I_2) * 2R_3 + V_{BE1} \quad \cdots\cdots(3)$$

$$= \frac{4k_b T}{q} \ln(N) \cdot \frac{R_3}{R_1} + V_{BE1} \cdot \frac{2R_3}{R_2} + V_{BE1}$$

$$= V_{BE1} \cdot \left(\frac{2R_3}{R_2} + 1\right) + \frac{4k_b T}{q} \ln(N) \cdot \frac{R_3}{R_1}$$

$$= \underbrace{\left(\frac{2R_3}{R_2} + 1\right)}_{M1} \underbrace{\left(V_{BE1} + \frac{k_b T}{q} \ln(N) \cdot \frac{4R_3}{R_1 \left(\frac{2R_3}{R_2} + 1\right)}\right)}_{M2} \quad \cdots(4)$$

$$V_{por} = \underbrace{\left(\frac{2R_3}{R_2} + 1\right)}_{M3} \underbrace{\left(V_{BE1} + \frac{k_b T}{q} \ln(N) \cdot \frac{4R_3}{R_1 \left(\frac{2R_3}{R_2} + 1\right)}\right)}_{M4} + \underbrace{\left(\frac{2R_3}{R_1}\right.}_{M5} \underbrace{\left.\left(\frac{1}{\ln(N)} - 1\right)\right) V_{os}}_{M6}$$

$$\cdots\cdots(5)$$

FIG. 13

$$I_1 = I_2 = \frac{(V_{BE1} - V_{BE2})}{R_2} \quad \cdots\cdots(11)$$

$$V_{BE1} - V_{BE2} = \frac{k_b T}{q}\ln(N) \quad \cdots\cdots(12)$$

$$V_{por} = V_{BE1} + R_1 I_2 \quad \cdots\cdots(13)$$

$$V_{por} = \underbrace{V_{BE1}}_{M11} + \underbrace{\frac{R_1(V_{BE1} - V_{BE2})}{R_2}}_{M12} \quad \cdots\cdots(14)$$

$$V_{por} = V_{BE1} + \frac{R_1(V_{BE1} - V_{BE2})}{R_2} + \frac{R_1}{R_2}V_{os} \quad \cdots\cdots(15)$$

FIG. 15

$$I_A R_2 = \Delta V_{BE} = \frac{k_b T \ln(N)}{q} \qquad \cdots\cdots(21)$$

$$I_B R_1 = V_{BE1} \qquad \cdots\cdots(22)$$

$$\begin{aligned}
V_{por} &= (I_A + I_B) R_3 & \cdots\cdots(23) \\
&= \frac{R_3}{R_2} \Delta V_{BE} + \frac{R_3}{R_1} \cdot V_{BE1} \\
&= \frac{R_3}{R_1} \Big( \underbrace{V_{BE1}}_{M21} + \underbrace{\frac{R_1}{R_2} \Delta V_{BE}}_{M22} \Big) & \cdots\cdots(24)
\end{aligned}$$

$$V_{por} = \frac{R_3}{R_1}\Big(V_{BE1} + \frac{R_1}{R_2}\Delta V_{BE}\Big) + \frac{R_3}{R_1}\frac{R_1}{R_2} V_{os} \quad \cdots\cdots(25)$$

$$I = \frac{V_{CC}}{\left(\frac{R_{103}(R_{101} + R_{102})}{R_{101}}\right)} = \frac{V_{por}}{R_3} \quad \cdots\cdots(26)$$

SEMICONDUCTOR DEVICE

CROSS-REFERENCE TO RELATED APPLICATIONS

The present application claims priority from Japanese Patent Application No. 2021-000625 filed on Jan. 6, 2021, the content of which is hereby incorporated by reference to this application.

BACKGROUND

The present disclosure relates to a semiconductor device, for example, is applicable to a semiconductor device having a power-on reset circuit.

A power-on reset circuit is a circuit, which outputs a reset signal until a power-supply voltage has a predetermined value, in order that a system configured by another semiconductor device etc. or another circuit incorporated in the same semiconductor device is prevented from malfunctioning at power-on. Such a power-on reset circuit is disclosed in, for example, Japanese patent application laid-open No. 2012-48349 as Patent Document 1 and ELECTRONICS LETTERS 28 May 2015 V0l. 51 No. 11 pp. 856-858 as Non-Patent Document 1.

SUMMARY

In IoT (Internet of Things) equipment or the like, an improvement of battery life due to a reduction in an operational lower limit voltage of a semiconductor device and a reduction in consumed current are expected to advance in the further. Required is a detecting technique of a lower voltage of the power-on reset circuit that issues the reset signal at the operational lower limit voltage or less of the semiconductor device.

Other problems and novel features will be apparent from the description of the present specification and the accompanied drawings.

An outline of representative one of the present disclosures will briefly be described as follows.

That is, a semiconductor device has a power-on reset circuit including: a first bipolar transistor; a second bipolar transistor configured by connecting a plurality of bipolar transistor in parallel; a detection-voltage adjusting resistance element; a temperature-characteristic adjusting resistance element; a current adjusting resistance element; and a comparator.

According to the present disclosure, the power-on reset circuit can be made low voltage.

BRIEF DESCRIPTION OF THE DRAWINGS

FIG. 4 is a diagram for explaining an operation of the power-on reset circuit illustrated in FIG. 3.

FIG. 13 is a diagram for explaining an operation of the power-on reset circuit illustrated in FIG. 12.

FIG. 15 is a diagram for explaining an operation of the power-on reset circuit illustrated in FIG. 14.

DETAILED DESCRIPTION

Figure 1:
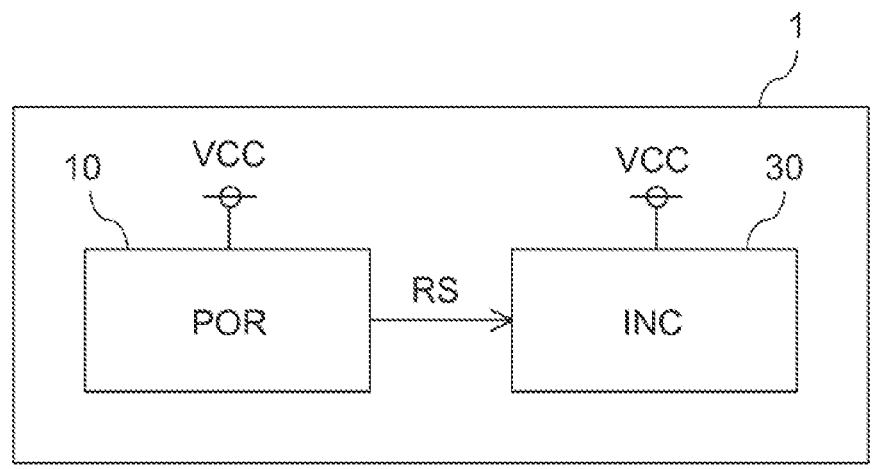
FIG. 1 is a block diagram showing a configuration of a semiconductor device according to an embodiment

Hereinafter, embodiments will be described with reference to the drawings. However, for the sake of clarification of the explanation, the following description and drawings will be omitted or simplified appropriately. Further, in the following description, the same components are denoted by the same reference numerals and a repetitive explanation thereof will be omitted.

FIG. 1 is a block diagram showing a configuration of a semiconductor device according to an embodiment. A semiconductor device 1 is an integrated circuit (IC) in which a power-on reset circuit (POR) 10 and an internal circuit (INC) 30 are included in one semiconductor chip. When the semiconductor device 1 is a microcontroller, the internal circuit 30 includes a central processing unit (CPU), a RAM (Random Access Memory), peripheral circuits, and the like. Incidentally, the power-on reset circuit 10 is not built in the semiconductor device 1, and may be formed on a semiconductor chip different from the semiconductor device 1.

The power-on reset circuit 10 outputs a reset signal (RS) to the internal circuit 30 according to a value of a power-supply voltage (VCC) when power is turned on and when the power-supply voltage (VCC) temporarily drops and the like. When an external power-supply voltage (VCC) is lower than a predetermined voltage, the reset signal (RS) is at a low level (hereinafter referred to as L level), and when the external power-supply voltage (VCC) becomes higher than the predetermined voltage, the reset signal (RS) is switches to a high level (hereinafter referred to as H level). Here, the L level of the reset signal (RS) is called a reset state. The H level of the reset signal (RS) is called a release of the reset state. A specific example of the power-on reset circuit 10 will be described with reference to FIG. 3.

Figure 2:
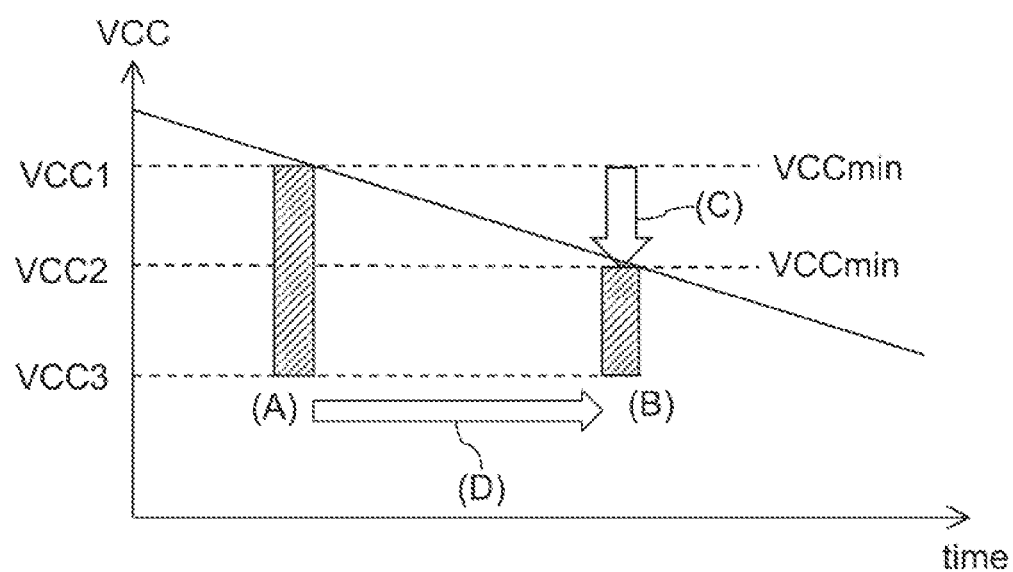
FIG. 2 is a diagram for explaining a problem of a power-on reset circuit.
Figure 5:
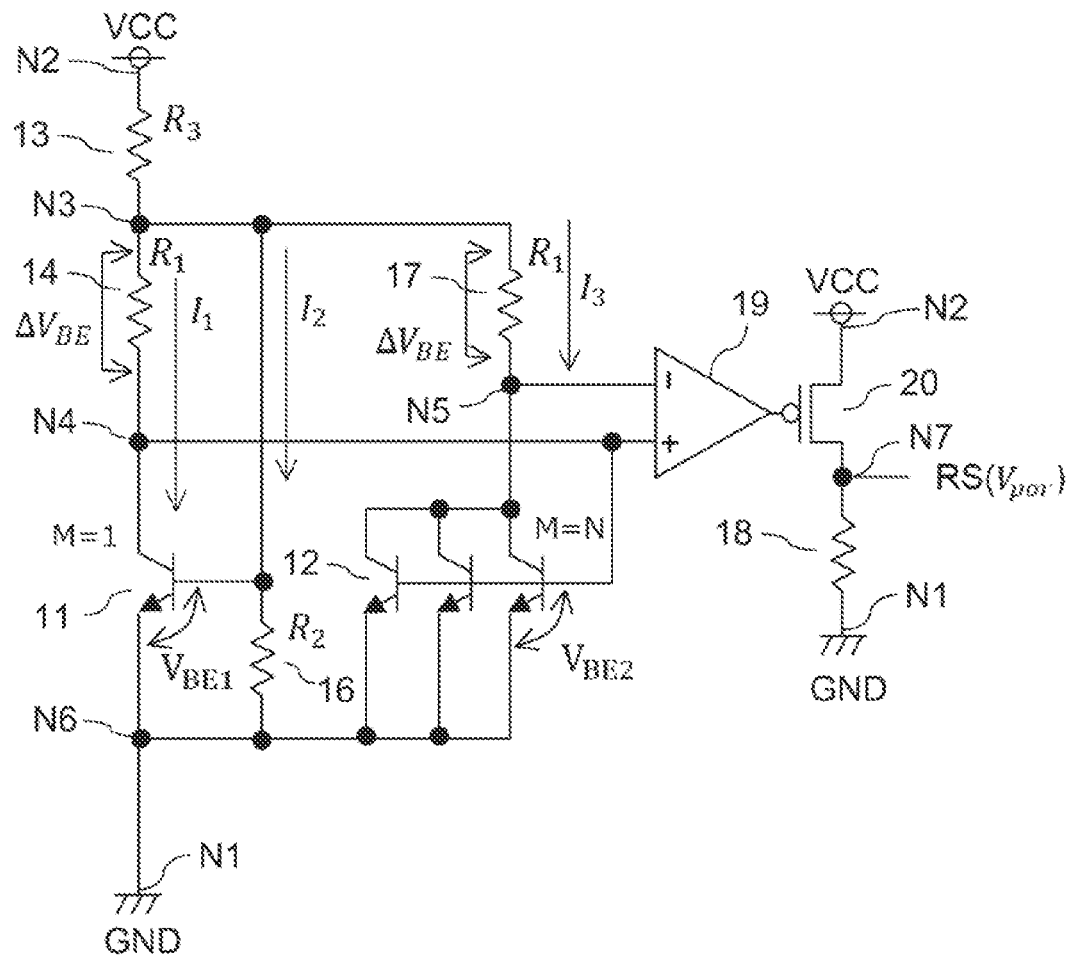
FIG. 5 is a circuit diagram showing another example of the configuration of the power-on reset circuit illustrated in FIG. 1.
Figure 6:
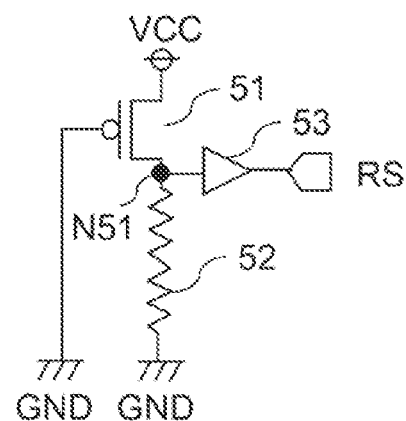
FIG. 6 is a circuit diagram showing a configuration of a power-on reset circuit of a first comparative example.
Figure 7:
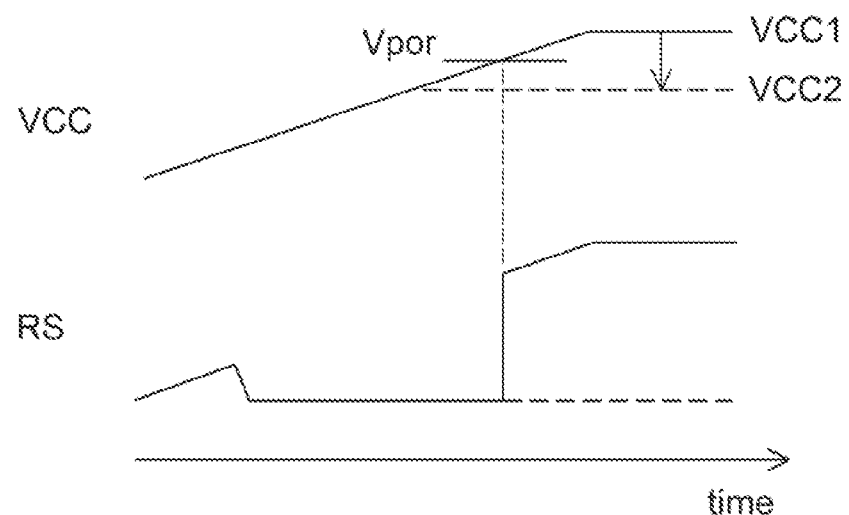
FIG. 7 is a diagram for explaining an operation of the power-on reset circuit illustrated in FIG. 6.

Here, in order to further clarify the semiconductor device in the embodiment, a problem on the power-on reset circuit 10 will be described with reference to FIGS. 2, 5 and 7. FIG. 2 is a diagram for explaining a problem of a power-on reset circuit. FIG. 5 is a circuit diagram showing a configuration of a power-on reset circuit of a first comparative example. FIG. 7 is a diagram for explaining an operation of the power-on reset circuit illustrated in FIG. 6.

As shown in FIG. 5, a power-on reset circuit of a first comparative example includes a PMOS (Positive Channel Metal Oxide Semiconductor) transistor 51, a resistance element 52, and a buffer circuit 53. The PMOS transistor 51 and the resistance element 52 are provided in series between a power-supply-voltage (VCC) line and a grounding-voltage (GND) line in this order. A gate of the PMOS transistor 51 receives a grounding voltage (GND). A node between the PMOS transistor 51 and the resistance element 52 is connected to the buffer circuit 53. The buffer circuit 53 outputs a reset signal (RS).

When the power-supply voltage (VCC) is 0 (zero) V, an intermediate potential node N51 is maintained at 0 V. After the power is turned on, a potential of the intermediate potential node N51 is maintained at 0 V while a gate-source voltage of the PMOS transistor 51 is equal to or lower than a threshold voltage of the transistor. As shown in FIG. 7, the reset signal (RS), which is an output of the buffer circuit 53, is at the L level. This state is the reset state. Thereafter, when the power-supply voltage (VCC) rises to a predetermined voltage and a current driving force of the PMOS transistor 51 becomes larger than a current driving force of the resistance element 52, a potential of the intermediate potential node N51 rises. When the potential of the intermediate potential node N51 exceeds a threshold potential of the buffer circuit 53, the reset signal (RS) becomes the H level and the reset state is released as shown in FIG. 7. Here, the above-mentioned predetermined voltage is referred to as a detection voltage (Vpor). The power-on reset has a detection circuit that detects a detection voltage (Vpor).

A battery power supply is discharged, and the power-supply voltage (VCC) drops with the passage of time. As a voltage of the semiconductor device 1 drops, an operational lower limit voltage (VCCmin) drops as shown by an arrow (C) of FIG. 2, so that a battery life is improved and an operational time of the semiconductor device 1 is extended as shown by an arrow (D) of FIG. 2.

As Shown by (A) of FIG. 2, when the operational lower limit voltage (VCCmin) is VCC1, the power-on reset circuit 10 needs to detect the detection voltage (Vpor) at a voltage lower than that of VCC1. That is, the power-on reset circuit 10 needs to operate in a range from VCC1 of the power-supply voltage to VCC3 thereof.

By making the semiconductor device 1 the lower voltage, as shown in (B) of FIG. 2, the power-on reset circuit 10 needs to detect the detection voltage (Vpor) at a voltage lower than the lower voltage (VCC2). If the detection voltage (Vpor) cannot be lowered, the reset signal (RS) cannot be released as shown by a broken line in FIG. 7. That is, the power-on reset circuit 10 needs to operate in a range from VCC2 of the power-supply voltage to VCC3 thereof.

Further, detection variations also need to be reduced as the detection voltage drops. Furthermore, in a battery-powered semiconductor device, a consumed current also needs to be reduced.

Figure 8:
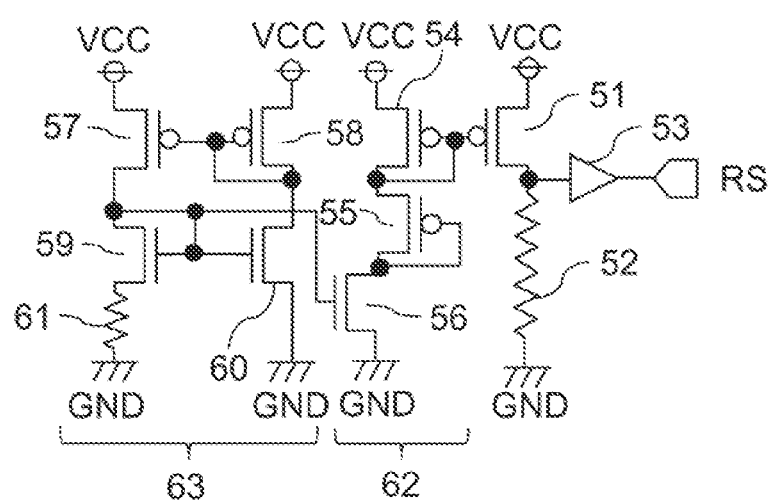
FIG. 8 is a circuit diagram showing a configuration of a power-on reset circuit of a second comparative example.
Figure 9:
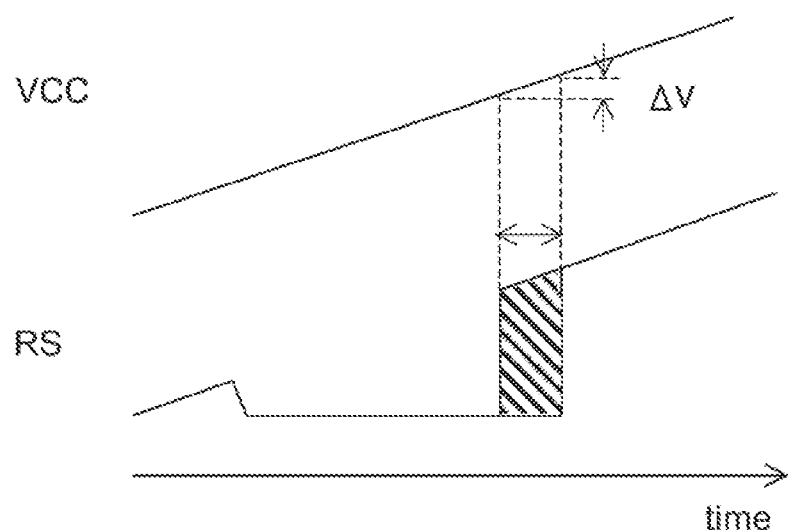
FIG. 9 is a diagram for explaining of an operation of the power-on reset circuit illustrated in FIG. 8.

Next, a power-on reset circuit of a second comparative example in which the detection variations of the detection voltage are reduced lower than those of the first comparative example will be described with reference to FIGS. 8 and 9. FIG. 8 is a circuit diagram showing a configuration of a power-on reset circuit of a second comparative example. FIG. 9 is a diagram for explaining an operation of the power-on reset circuit illustrated in FIG. 8.

As shown in FIG. 8, in a power-on reset circuit of a second comparative example, a detection circuit 62 for adjusting a detection voltage and a constant-current generating circuit 63 are added to the power-on reset circuit of the first comparative example. The detection circuit 62 includes PMOS transistors 54, 55 and an NMOS (Negative Channel Metal Oxide Semiconductor) transistor 56. The PMOS transistors 54, 55 and the NMOS transistors 56 are connected in series between a power-supply-voltage (VCC) line and a grounding-voltage (VSS) line. Gates of the PMOS transistors 54, 51 are both connected to a drain of the PMOS transistor 54. The gate of the PMOS transistor 55 is connected to a drain of the PMOS transistor 55 to form a diode. A gate of the NMOS transistor 56 is connected to an output of the constant-current generating circuit 63. A current of a level corresponding to an output voltage of the constant-current generating circuit 63 flows through the NMOS transistor 56.

The constant-current generating circuit 63 includes PMOS transistors 57, 58, NMOS transistors 59, 60, and a resistance element 61. The PMOS transistor 57, the NMOS transistor 59, and the resistance element 61 are connected in series between a power-supply-voltage (VCC) line and a grounding-voltage (VSS) line. The PMOS transistor 58 and the NMOS transistor 60 are connected in series between the power-supply-voltage (VCC) line and the grounding-voltage (VSS) line. Gates of the PMOS transistors 57, 58 are both connected to a drain of the PMOS transistor 58. Gates of the NMOS transistors 59, 60 are both connected to a drain (output of the constant-current generating circuit 63) of the NMOS transistor 59. A value of a constant current of the constant-current generating circuit 63 is determined by a difference between gate voltages of the NMOS transistors 59, 60 and by a resistance value of the resistance element 61. At the output of the constant-current generating circuit 63, a bias voltage at a level corresponding to the constant current appears.

The resistance of the power-on reset circuits and the PMOS transistors in the first comparative example and the second comparative example have large process variations and temperature dependence. The variations of the power-on reset circuit in the second comparative example are smaller than those of the power-on reset circuit in the first comparative example, but the variations ($\Delta V$) of the detection voltage are still about 600 mV. Therefore, as shown in FIG. 9, detection-voltage accuracy of the power-on reset circuits in the first comparative example and the second comparative example is considerably poor Incidentally, power consumption of the power-on reset circuit in the second comparative example is about several hundred nA.

Moreover, it is difficult to set the detection voltage to about 1 V or more by using only the resistance element 52 and PMOS transistor 51. Since the detection voltage is raised by Vth with a diode PMOS (PMOS transistor 55), it is difficult to adjust it up to a desired voltage. Therefore, it is difficult to adjust the detection voltages of the power-on reset circuits in the first comparative example and the second comparative example.

Figure 10:
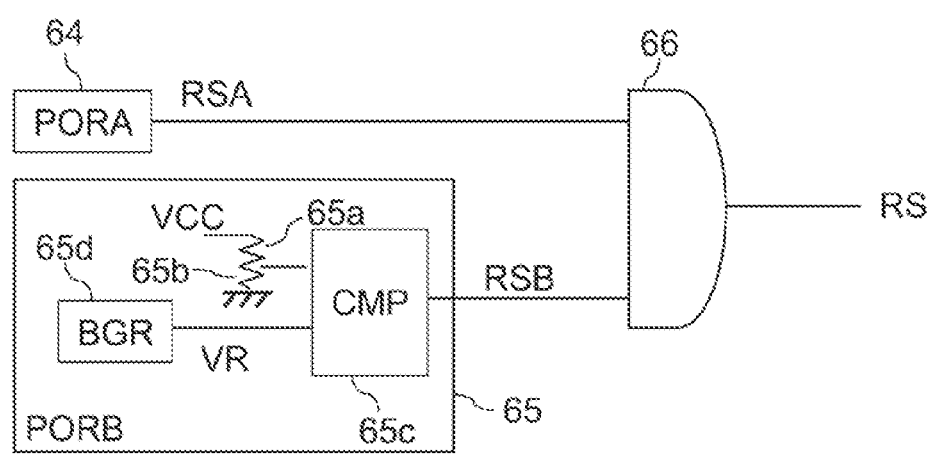
FIG. 10 is a view showing a configuration of a power-on reset circuit of a third comparative example.
Figure 11:
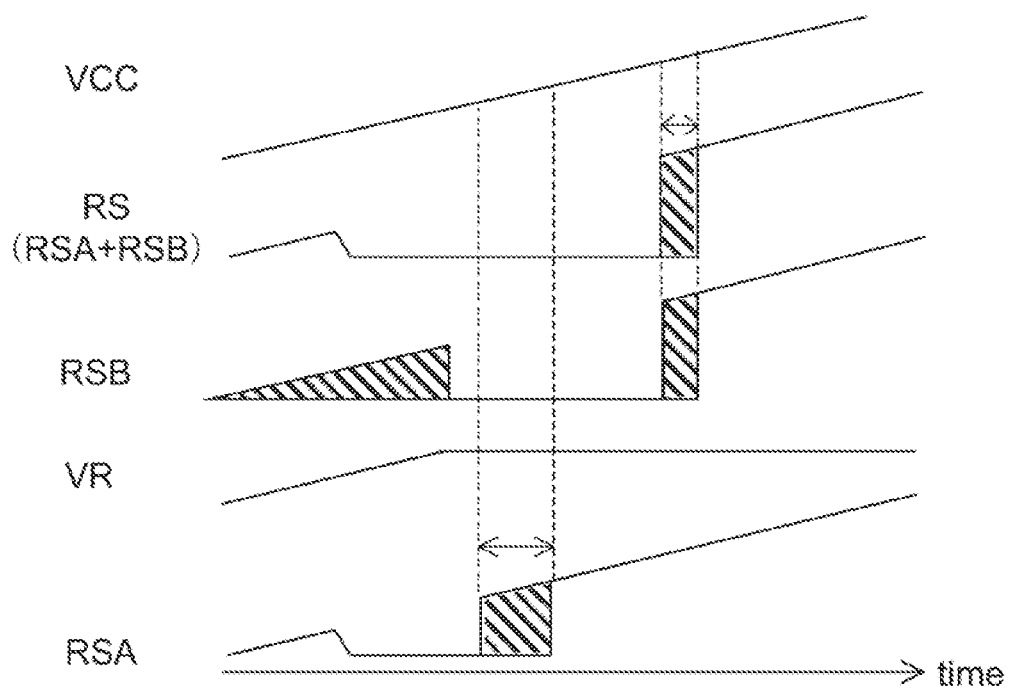
FIG. 11 is a diagram for explaining an operation of the power-on reset circuit illustrated in FIG. 10.

Next, a power-on reset circuit of a third comparative example in which the detection variations of the detection voltage are reduced lower than those of the second comparative example will be described with reference to FIGS. 10 and 11. FIG. 10 is a view showing a configuration of a power-on reset circuit of a third comparative example. FIG. 11 is a diagram for explaining an operation of the power-on reset circuit illustrated in FIG. 10.

A power-on reset circuit of a third comparative example includes a first power-on reset circuit (PORA) 64 and a second power-on reset circuit (PORB) 65. The first power-on reset circuit (PORA) 64 is composed of the power-on reset circuit of the first comparative example or the second comparative example, and a first reset signal (RSA) is outputted therefrom.

The second power-on reset circuit (PORB) 65 includes resistance elements 65a, 65b, a comparator (CMP) 65c operated by a power-supply voltage (VCC), and a bandgap reference circuit (BGR) 65d. The resistance elements 65a, 65b are connected in series between a power-supply node that receives the power-supply voltage (VCC) and a grounding node that receives the grounding voltage (GND). A non-inverting input terminal of the comparator 65c is connected to a connection node between the resistance elements 65a, 65b. A reference voltage (VR) outputted from a bandgap reference circuit (BGR) 65d is inputted to an inverting input terminal of the comparator 65c. A second reset signal (RSB) is outputted from an output terminal of the comparator 65c. When a detection voltage of the connection node exceeds the reference voltage (VR), the second reset signal (RSB) becomes the H level and the reset state is released.

Since the first power-on reset circuit (PORA) 64 is composed of the power-on reset circuit in the first comparative example or the second comparative example, as shown in FIG. 11, initial-rise variations of the first reset signal (RSA) are great.

The second power-on reset circuit (PORB) 65 can suppress initial rise variations of the second reset signal (RSB) by comparing the reference voltage (VR) and the power-supply voltage (VCC). However, as shown in FIG. 11, the second power-on reset circuit (PORB) 65 performs an indeterminate output until the bandgap reference circuit (BGR) 65d operates. Incidentally, the reference voltage (VR) at a time when the bandgap reference circuit (BGR) 65d is stable is about 1 V.

Therefore, at an operating voltage or less of the bandgap reference circuit (BGR) 65d, the second reset signal (RSB) is masked by the first reset signal (RSA) of the first power-on reset circuit (PORA) 64 in a synthesis circuit 66, and compensates for an output of the L level.

In the power-on reset circuit of the third comparative example, the detection of the detection voltage (Vpor) can be set only to a value equal to or more than those of the operational lower limit voltage of the bandgap reference circuit (BGR) 65d and the detection variations of the first power-on reset circuit (PORA) 64. For example, the operational lower limit voltage of the bandgap reference circuit (BGR) 65d is about 1.5 V, and the detection variations of the first power-on reset circuit (PORA) 64 are about 0.6 V, so the detection voltage (Vpor) is 2 is detected near 2.1 V. Therefore, it is difficult for the power-on reset circuit in the third comparative example to detect a low voltage of the detection voltage (Vpor). Incidentally, the detection variations of the power-on reset circuit in the third comparative example are about 80 mV, which is improved so as to become higher than the detection-voltage accuracy of the power-on reset circuit in the second comparative example. However, the power consumption of the power-on reset circuit in the third comparative example is about several μA, which is higher than the power consumption of the power-on reset circuit in the second comparative example.

Incidentally, the output of the bandgap reference circuit (BGR) 65d may be used as a reference voltage for other internal circuits, and the bandgap reference circuit (BGR) 65d may have a trimming function. At an initial rise of the power-supply voltage, a trimming value from a non-volatile memory such as a flash memory becomes indeterminate. Since the power-on reset circuit is used at the initial rise of power-on, trimming becomes indeterminate and the detection variations increase. Therefore, measures such as trimming and fixing needs to be taken so as not to be affected from such trimming's indeterminate state and increase in the variations.

Figure 12:
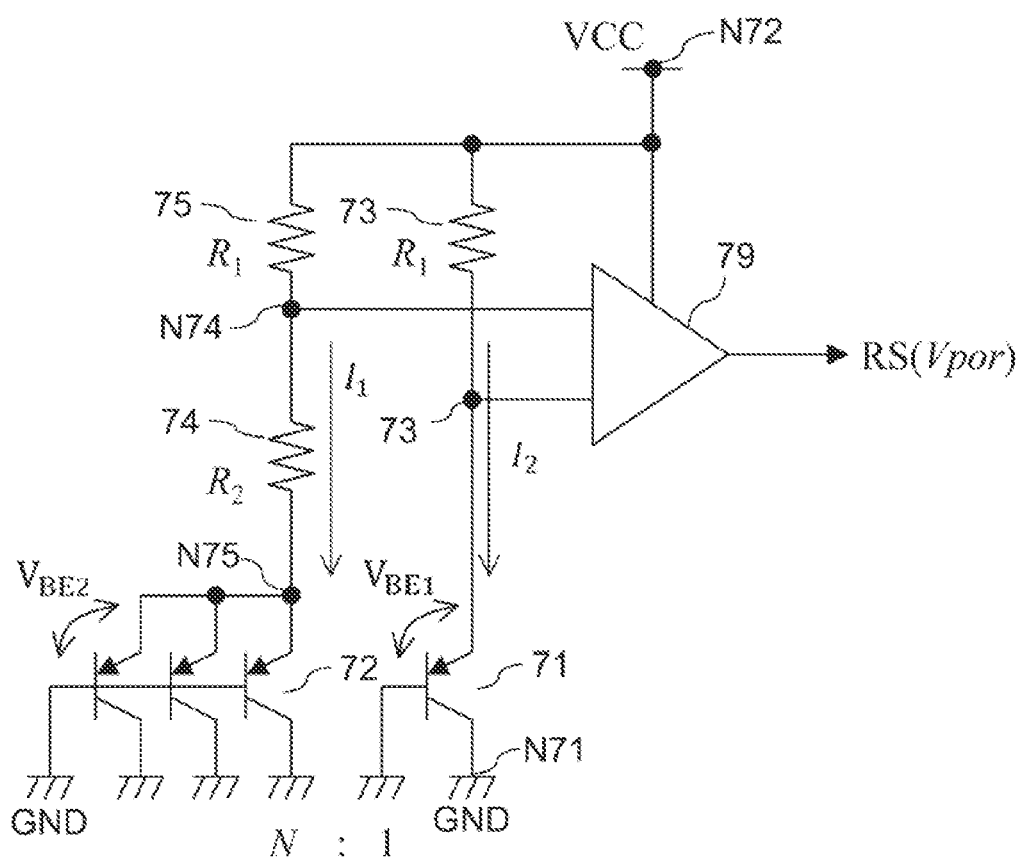
FIG. 12 is a circuit diagram showing a configuration of a power-on reset circuit of a fourth comparative example.

Next, a power-on reset circuit of a fourth comparative example for making the detection voltage lower will be described with reference to FIGS. 12 and 13. FIG. 12 is a circuit diagram showing an example of a configuration of a power-on reset circuit of a fourth comparative example. FIG. 13 is a diagram for explaining an operation of the power-on reset circuit illustrated in FIG. 12.

A power-on reset circuit of a fourth comparative example includes PNP type bipolar transistors 71, 72, resistance elements 73 to 75, and a comparator 79 composed of an operational amplifier. The bipolar transistor 72 is formed by connecting N bipolar transistors in parallel. Resistance values of the resistance elements 73, 75 are $R_1$, and a resistance value of the resistance element 74 is $R_2$. The comparator 79 operates by the power-supply voltage (VCC). First, connection between these components will be described.

The bipolar transistor 71 and the resistance element 73 are connected in series between a grounding node N71 that receives the grounding voltage (VSS) and a power-supply node N72 that receives the external power-supply voltage (VCC) in this order. A collector and a base of the bipolar transistor 71 are connected to the grounding node N71. An emitter of the bipolar transistor 71 is connected to one end of the resistance element 73, and its connecting points forms a node N73. The other end of the resistance element 73 is connected to the power-supply node N72.

The bipolar transistor 72 and the resistance elements 74, 75 are connected in series between the grounding node N71 and the power-supply node N72 in this order. A collector and a base of the bipolar transistor 72 are connected to the grounding node N71. An emitter of the bipolar transistor 72 is connected to one end of the resistance element 74, and its connecting point forms a node N74. The other end of the resistance element 74 is connected to one end of the resistance element 75, and its connecting point forms a node N74. The other end of the resistance element 75 is connected to the power-supply node N72.

The inverting input terminal of the comparator 79 is connected to the node N74, and the non-inverting input terminal thereof is connected to the node N73. It is detected that a voltage level of the output signal is inverted and the power-supply voltage (VCC) becomes a predetermined voltage value (Vpor) when the input voltages of the inverting input terminal and the non-inverting input terminal of the comparator 79 become the same voltage. At this time, a first current ($I_1$) of the resistance elements 74, 75 and a second current ($I_2$) of the resistance element 73 become equal to each other.

Since the voltage of the node N73 and the voltage of the node N74 are equal, $V_{BE1}=I_1 \times R_2+V_{BE2}$ and the first current ($I_1$) is represented by expression (11) shown in FIG. 13. Here, $V_{BE1}$ is a base-emitter voltage of the bipolar transistor 71. $V_{BE2}$ is a base-emitter voltage of the bipolar transistor 72. Further, since the second current ($I_2$) is equal to the first current ($I_1$), the second current ($I_2$) is represented by expression (11) shown in FIG. 13.

Further, a potential difference ($V_{BE2}-V_{BE1}$) between the emitters of the bipolar transistor 71 and the bipolar transistor 72 is represented by expression (12) shown in FIG. 13. Here, kb represents the Boltzmann constant, T represents absolute temperature, q represents electron charge, N represents the number of parallel connected bipolar transistors 72, and In represents natural logarithm.

The power-supply voltage (VCC) is a voltage that is obtained by adding $V_{BE1}$ and a voltage generated by the second current ($I_2$) flowing through the resistance element 73. That is, the detection voltage (Vpor) serving as the power-supply voltage (VCC), in which the comparator 79 reverses, is represented by expression (13) shown in FIG. 13. By substituting expression (11) into expression (13) shown in FIG. 6, expression (14) shown in FIG. 13 can be obtained. Here, a term M11 of expression (14) has a negative temperature characteristic, and a term M12 has a positive temperature characteristic. Therefore, adding a voltage having the negative temperature characteristic and a voltage having the positive temperature characteristic make it possible to be canceled and be detected with a voltage value having no temperature dependence.

However, if resistance is adjusted so as to reduce the temperature dependence, a right side of expression (14) shown in FIG. 13 becomes almost constant and the detection voltage (Vpor) can be set only near 1.2 V, so that the detection voltage cannot be adjusted.

Further, a detection-voltage equation considering an offset effect is expression (15) shown in FIG. 13, and when an offset (Vos) occurs in the comparator 79, the offset becomes $R_1/R_2$ times, thereby increasing the detection variations. In order to reduce the temperature dependence, the $R_1/R_2$ needs to be set at about 10 times and, as a result, the offset increases times. Therefore, the detection-voltage accuracy deteriorates. The detection variations of the power-on reset circuit in the fourth comparative example are about 130 mV, and the power consumption is about several hundred nA.

Figure 14:
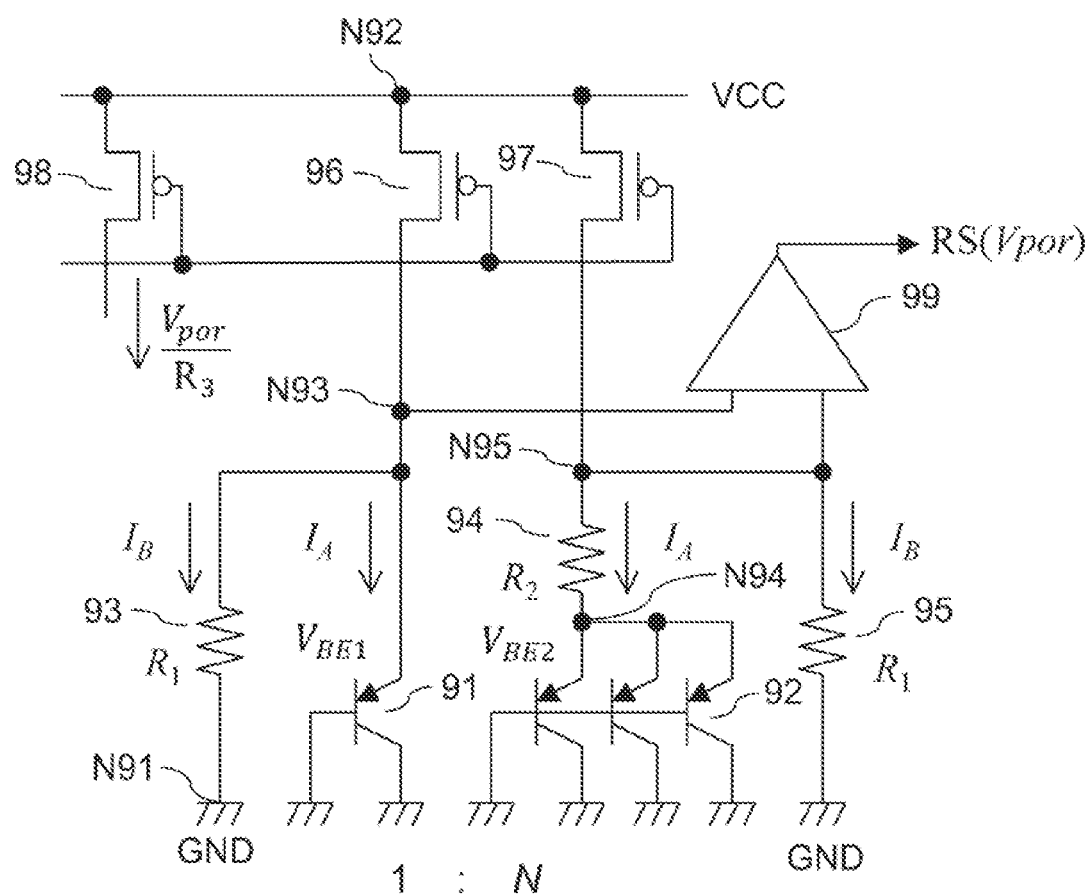
FIG. 14 is a circuit diagram showing a configuration of a power-on reset circuit of a fifth comparative example.
Figure 16:
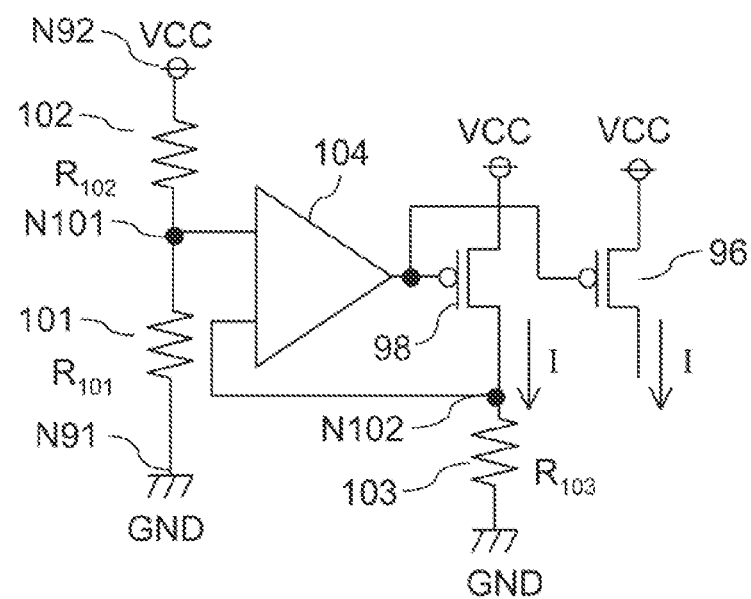
FIG. 16 is a circuit diagram showing a configuration of a current source used in the power-reset circuit illustrated in FIG. 14.

Next, a power-on reset circuit of a fifth comparative example, in which the detection voltage can be adjusted, will be described with reference to FIGS. 14 to 16. FIG. 14 is a circuit diagram showing a configuration of a power-on reset circuit of a fifth comparative example. FIG. 15 is a diagram for explaining an operation of the repower-on reset circuit illustrated in FIG. 14. FIG. 16 is a circuit diagram showing a configuration of a current source used in the power-on reset circuit shown in FIG. 14.

As shown in FIG. 14, a power-on reset circuit of a fifth comparative example includes PNP type bipolar transistors 91, 92, resistance elements 93 to 95, a comparator 99 composed of an operational amplifier, and PMOS transistors 96 to 98. The bipolar transistor 92 is formed by connecting N bipolar transistors in parallel. Each resistance value of the resistance elements 93, 95 is $R_1$, and a resistance value of the resistance element 94 is $R_2$. The comparator 99 operates by a power-supply voltage (VCC). First, connection between these components will be described.

The bipolar transistor 91 and the PMOS transistor 96 are connected in series between a grounding node N91 that receives the grounding voltage (VSS) and a power-supply node N92 that receives the external power-supply voltage (VCC) in this order. A collector and a base of the bipolar transistor 91 are connected to the grounding node N91. An emitter of the bipolar transistor 91 is connected to a drain of the PMOS transistor 96, and its connecting point forms a node N93. A source of the PMOS transistor 96 is connected to the power-supply node N92. One end of the resistance element 93 is connected to the node N93, and the other end thereof is connected to the grounding node N91.

The bipolar transistor 92, the resistance element 94, and the PMOS transistor 97 are connected in series between the grounding node N91 and the power-supply node N92 in this order. A collector and abase of the bipolar transistor 92 are connected to the grounding node N91. An emitter of the bipolar transistor 92 is connected to one end of the resistance element 94, and its connecting point forms a node N94. The other end of the resistance element 94 is connected to a drain of the PMOS transistor 97, and its connecting point forms a node N95. A source of the PMOS transistor 97 is connected to the power-supply node N92. One end of the resistance element 95 is connected to the node N95, and the other end thereof is connected to the grounding node N91.

An inverting input terminal of the comparator 99 is connected to the node N95, and a non-inverting input terminal is connected to the node N93. It is detected that a voltage level of an output signal is inverted and the power-supply voltage (VCC) becomes (reaches) a predetermined voltage value (Vpor) when input voltages of the inverting input terminal and the non-inverting input terminal of the comparator 99 become the same voltage.

Since a voltage of the node N93 and a voltage of the node N94 are equal, $V_{BE1}=I_A \times R_2+V_{BE2}$ and a first current ($I_A$) is represented by expression (21) shown in FIG. 15. Here, $V_{BE1}$ is a base-emitter voltage of the bipolar transistor 91. $V_{BE2}$ is a base-emitter voltage of the bipolar transistor 92. $\Delta V_{BE}$ is a potential difference ($V_{BE1}-V_{BE2}$) between the emitters of the bipolar transistor 91 and the bipolar transistor 92. Here, kb represents the Boltzmann constant, T represents absolute temperature, q represents electron charge, N represents the number of parallel connected bipolar transistors 92, and ln represents natural logarithm. Further, a second current ($I_B$) is represented by expression (22) shown in FIG. 15.

A current flowing through the PMOS transistor 96 is the same as a current flowing through the PMOS transistor 98 as a current source, and is equal to the sum of the first current ($I_A$) and the second current ($I_B$). That is, a detection voltage (Vpor), which is the power-supply voltage (VCC) and which the comparator 99 reverses, is represented by expression (23) shown in FIG. 15. Here, $R_3$ is a resistance value defined by expression (26) shown in FIG. 16. By substituting expressions (21) and (22) into expression (23) shown in FIG. 15, expression (24) shown in FIG. 15 can be obtained. Here, a term M21 of expression (24) has a negative temperature characteristic, and a term M22 has a positive temperature characteristic. Therefore, by adding a voltage having the negative temperature characteristic and a voltage having the positive temperature characteristic, the added voltages are cancelled and can be detected with a voltage value having no temperature dependence.

However, a detection-voltage equation considering an offset effect is expression (25) shown in FIG. 15, and when an offset (Vos) occurs in the comparator 79, the offset becomes $(R_3/R_1) \times (R_1/R_2)$ times to increase detection variations. When the detection voltage is about 2.4 V, $R_3/R_1$ needs to be set at about 2 and $R_1/R_2$ needs to be set at about 10 times in order to reduce the temperature dependence. As a result, the offset increases at 20 times. Therefore, the detection-voltage accuracy deteriorates. The detection variations of the power-on reset circuit in the fifth comparative example are about 130 mV, and the power consumption is about several μA.

Next, a current generating circuit of the power-on reset circuit shown in FIG. 14 will be described with reference to FIG. 16. A current generating circuit includes resistance elements 101 to 103, a comparator 104 composed of an operational amplifier, and a PMOS transistor 98. The comparator 104 operates by the power-supply voltage (VCC).

The resistance elements 101, 102 are connected in series between a grounding node N91 and a power-supply node N92 in this order. One end of the resistance element 101 is connected to the grounding node N91, the other end thereof is connected to one end of the resistance element 102, and its connecting point forms a node N101.

The resistance element 103 and the PMOS transistor 98 are connected in series between the grounding node N91 and the power-supply node N92 in this order. One end of the resistance element 103 is connected to the grounding node N91, the other end thereof is connected to a drain of the PMOS transistor 98, and its connecting point forms a node N102. A source of the PMOS transistor 98 is connected to the power-supply node N92.

An inverting input terminal of the comparator 104 is connected to the node N101, a non-inverting input terminal thereof is connected to the node N102, and an output terminal thereof is connected to a gate of the PMOS transistor 98.

A current (I) generated by the current generating circuit as shown in FIG. 16 is represented by expression (26) shown in FIG. 16. It is difficult to generate a current of $1/R_3$ shown in expression (26). That is, since resistor and capacitance are connected and adjusted so as not to oscillate an output, an area is increased and circuit design becomes complicated. In addition, variations in current increase several tens of times as much as variations in detection voltage. In addition, a lower voltage is difficult to detect since an operational lower limit is difficult to reduce. Furthermore, the consumed current is also difficult to reduce.

Figure 3:
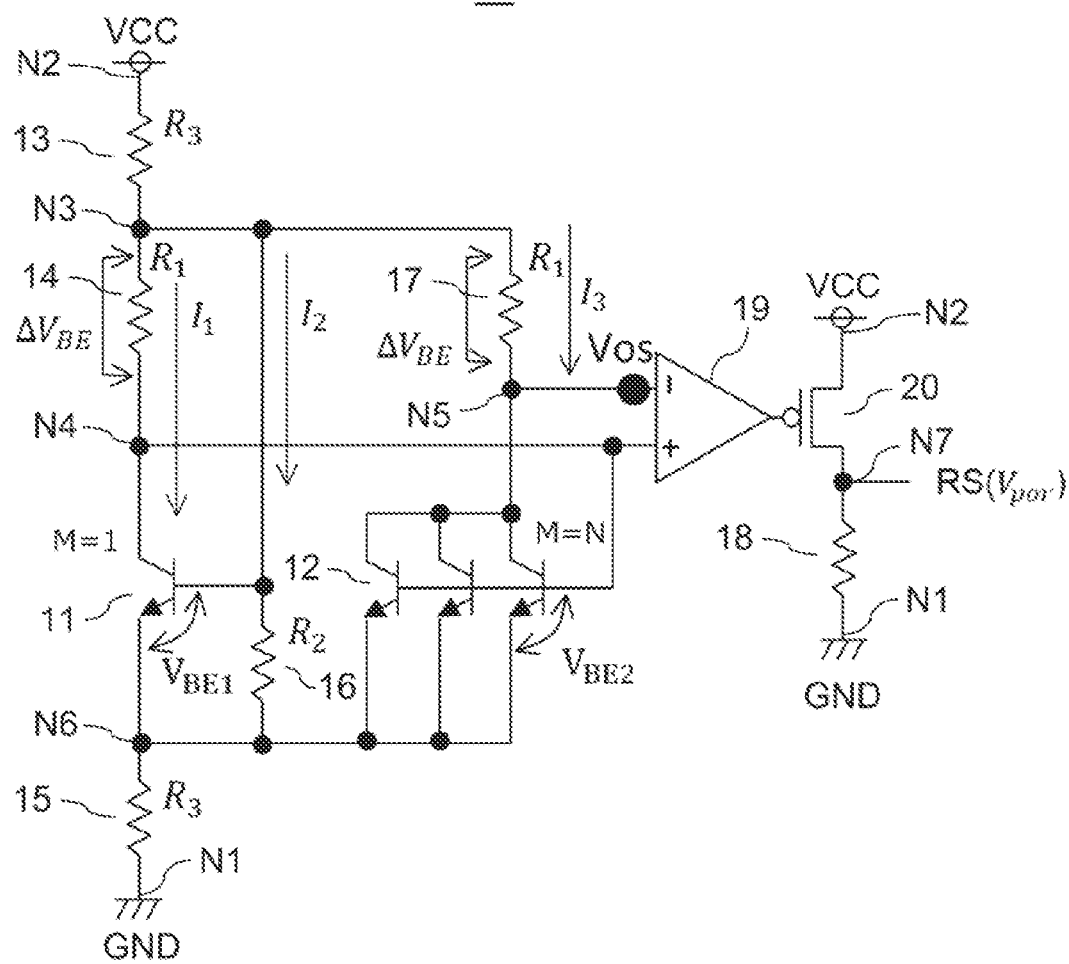
FIG. 3 is a circuit diagram showing an example of a configuration of the power-on reset circuit illustrated in FIG. 1.

Next, a configuration of a power-on reset circuit 10 of an embodiment will be described with reference to FIG. 3. FIG. 3 is a circuit diagram showing an example of a configuration of the power-on reset circuit illustrated in FIG. 1.

A power-on reset circuit 10 includes NPN type bipolar transistors 11, 12, resistance elements 13 to 18, a comparator 19 composed of an operational amplifier, and a PMOS transistor 20. The bipolar transistor 12 as a second bipolar transistor is formed by connecting N bipolar transistors in parallel. The comparator 19 operates by an external power-supply voltage (VCC). First, connection between these components will be described.

The resistance elements 13, 14, the bipolar transistor 11 as a first bipolar transistor, and a resistance element 15 are connected between a power-supply node N2 that receives the external power-supply voltage (VCC) and a grounding node N1 that receives the grounding voltage (GND) in this order. Here, the grounding node N1 is also referred to as first node, and the power-supply node N2 is also referred to as a second node. One end of the resistance element 13 as a fourth resistance element is connected to the power-supply node N2. The other end of the resistance element 13 is connected to one end of the resistance element 14 as a first resistance element, and its connecting point forms a node N3 as a third node. The other end of the resistance element 14 is connected to a collector of the bipolar transistor 11, and its connecting point forms a node N4 as a fourth node. An emitter of the bipolar transistor 11 is connected to one end of the resistance element 15 as a fifth resistance element, and its connecting point forms a node N6 as a sixth node. A base of the bipolar transistor 11 is connected to the node N3.

One end of the resistance element 16 as a second resistance element is connected to a base (node N3) of the bipolar transistor 11, and the other end thereof is connected to the node N6.

The resistance element 17 as a third resistance element and the bipolar transistor 12 are connected in series between the node N3 and the, node N6 in this order. One end of the resistance element 17 is connected to the node N3. The other end of the resistance element 17 is connected to a collector of the bipolar transistor 12, and its connecting point forms a node N5. An emitter of the bipolar transistor 12 is connected to the node N6. A base of the bipolar transistor 12 is connected to the node N4.

Here, the resistance elements 14, 17 are temperature-characteristic adjusting resistance elements, and its resistance value is $R_1$. The resistance element 16 is a current adjusting resistance element, and its resistance value is $R_2$. The resistance elements 13 and 15 are detection-voltage adjusting resistance elements, and each of their resistance values is $R_3$.

An inverting input terminal of the comparator 19 is connected to the node N5, a non-inverting input terminal thereof is connected to the node N4, and an output terminal thereof is connected to a gate of the PMOS transistor 20.

The resistance element 18 and the PMOS transistor 20 are connected in series between the grounding node N1 and the power-supply node N2 in this order. One end of the resistance element 18 is connected to the grounding node N1. The other end of the resistance element 18 is connected to a drain of the PMOS transistor 20, and its connecting point forms an output node N7. A source of the PMOS transistor 20 is connected to the power-supply node N2. A reset signal (RS) is outputted from the output node N7. Here, the resistance element 18 is a resistance element in order to ensure that the reset signal (RS) is outputted at the L level at a time of a lower voltage thereof.

When the power-supply voltage (VCC) is 0 V, the output node N7 is maintained at 0 V. After power-on, a potential of the output node N7 is maintained at 0 V while a gate-source voltage of the PMOS transistor 20 is equal to or lower than a threshold voltage of the transistor. This state is the reset state. Thereafter, when the power-supply voltage (VCC) rises to a predetermined voltage and an output of the comparator 19 is inverted to the L level, a current driving force of the PMOS transistor 20 becomes larger than a current driving force of the resistance element 16 and a potential of the output node N7 rises and the reset state is released.

An operation of the power-on reset circuit 10 will be described with reference to FIGS. 3 and 4. FIG. 4 is a diagram for explaining an operation of the power-on reset circuit.

It is detected that a voltage level of an output signal is inverted and the power-supply voltage (VCC) becomes a detection voltage (Vpor) when input voltages of the inverting input terminal and the non-inverting input terminal of the comparator 19 become the same voltage. At this time, a first current ($I_1$) of the resistance element 14 and a third current ($I_3$) of the resistance element 17 become equal.

The resistance element 14 is connected between the bipolar transistor 11 and the base of the bipolar transistor 12. The first current ($I_1$) is generated in the resistance element 14 by a potential difference ($\Delta V_{BE}$ ($=V_{BE2}-V_{BE1}$)) between the bipolar transistor 11 and the base of the bipolar transistor 12. Here, $V_{BE1}$ is a base-emitter voltage of the bipolar transistor 11. $V_{BE2}$ is a base-emitter voltage of the bipolar transistor 12.

The first current ($I_1$) is represented by expression (1) shown in FIG. 4. Here, $\Delta V_{BE}$ represents each voltage of the resistance elements 14, 17. kb represents the Boltzmann constant, T represents absolute temperature, C represents electron charge, N represents the number of parallel connected bipolar transistors 12, and In represents natural logarithm. The first current ($I_1$) has a positive temperature characteristic in which a current value increases as temperature rises.

The resistance element 16 is connected between the base and the emitter of the bipolar transistor 11. The second current ($I_2$) is generated in the resistance element 16 by a base-emitter voltage ($V_{BE1}$). The second current ($I_2$) is represented by expression (2) shown in FIG. 4. The second current ($I_2$) has a negative temperature characteristic in which a current value decreases as temperature rises.

The resistance element 15 is connected to the grounding node N1, and the resistance element 13 is connected to the node N2. The power-supply voltage (VCC) becomes a voltage obtained by adding $V_{BE1}$ and a voltage that is generated by the total current of the first current ($I_1$), the second current ($I_2$), and the third current ($I_3$) flowing through the resistance elements 13, 15.

That is, the detection voltage (Vpor), which is the power-supply voltage (VCC) and which the comparator 19 reverses, is represented by expression (3) shown in FIG. 4. By substituting expressions (1) and (2) into expression (3) shown in FIG. 4, expression (4) shown in FIG. 4 can be obtained. Here, a term M1 of expression (4) has a negative temperature characteristic, and a term M2 has a positive temperature characteristic. Therefore, by adding a voltage having a negative temperature characteristic and a voltage having a positive temperature characteristic, the added voltages are cancelled and can be detected with a voltage value having no temperature dependence.

Further, for example, it is assumed that the sum of the term M1 and the term M2 in expression (4) is 1.2 V, the resistance values ($R_3$) of the resistance elements 13, 15 are adjusted to become a detection voltage obtained by multiplying 1.2 V by ($2R_3/R_2+1$). If the detection voltage has 1.2 V or more, it can be adjusted to a desired value.

Furthermore, even if an offset (Vos) occurs in the comparator 19, such an operation is performed as to be cancelled as described below and the variations in the detection voltage is suppressed.

When the current ($I_3$) decreases due to the offset (Vos), the base-emitter voltage ($V_{BE2}$) of the bipolar transistor 12 drops. Consequently, the voltage ($\Delta V_{BE}$) of the resistance element 14 increases, and the first current ($I_1$) increases. Therefore, such an operation is performed that the total current ($I_1+I_2+I_3$) does not change. Since the resistance elements 13, 15 perform the detection only with substantially the same current value, the detection variations are small.

A detection-voltage equation in consideration of the offset effect is expression (5) shown in FIG. 4, thereby being able to suppress its fluctuation by "ln (N)" represented in "(1/ln (N)–1) Vos" of an item M6 of expression (5).

For example, when the detection voltage is about 2.4 V, "($2R_3/R_2+1$)" of an item M3 in expression (5) is about 2. In order to reduce the temperature dependence, "($4R_3/R_1$ ($2R_3/R_2+1$))" of the term M4 in expression (5) needs to be made about 10, so that the "$2R_3/R_1$" of the term M5 in expression (5) becomes about 10. Since N, which is the number of parallel connected bipolar transistors 12, is approximately 4 to 8, "(1/ln (N)–1)" of the item M6 in expression (5) becomes 0.3 to 0.5, so that the detection variations increase by about 3 to 5 times of Vos. However, these detection variations can be made smaller 10 times than those of the fourth comparative example and 20 times than those of the fifth comparative example. Incidentally, the detection variations of the power-on reset circuit 10 is about 80 mV.

The power consumption of the power-on reset circuit 10 is about several hundred nA, which can be made smaller than about several μA of those in the third comparative example and the fifth comparative example. Further, the power-on reset circuit 10 does not require the reference-voltage generating circuit of the third comparative example, and does not require trimming control. Using the power-on reset circuit 10 makes it possible to lower an operation guaranteed voltage of the semiconductor device and to improve the battery life thereof.

Another configuration of the power-on reset circuit 10 will be described with reference to FIG. 5. FIG. 5 is a circuit diagram showing another example of the configuration of the power-on reset circuit illustrated in FIG. 1.

As shown in FIG. 5, the power-on reset circuit 10 may not have the resistance element 15 connected between the grounding node N1 and the node N6 shown in FIG. 3. Further, the power-on reset circuit 10 may not have the resistance element 13 connected between the power-supply node N2 and the node N3 shown in FIG. 3.

The disclosure made by the present disclosers has been specifically described above based on the embodiment. The present disclosure is not limited to the above embodiment and, needless to say, can be variously modified or changed.

What is claimed is:

1. A semiconductor device having a power-on reset circuit, the power-on reset circuit comprising:
    a first bipolar transistor;
    a second bipolar transistor configured so that N bipolar transistors are connected in parallel;
    a comparator having an inverting input terminal, a non-inverting input terminal, and an output terminal;
    a first resistance element connected between a base of the first bipolar transistor and a base of the second bipolar transistor to generate a first current having a positive temperature characteristic in which a current value increases as temperature rises;
    a second resistance element connected between the base and an emitter of the first bipolar transistor to generate a second current having a negative temperature characteristic in which a current value decreases as temperature rises;
    a third resistance element connected between the base of the first bipolar transistor and the inverting input terminal to generate a third current having the positive temperature characteristic; and
    a fourth resistance element connected so as to carry a fourth current that is a total current of the first current, second current, and third current,
    wherein a collector of the first bipolar transistor and the base of the second bipolar transistor are connected to the non-inverting input terminal,
    wherein the power-on reset circuit is configured so that a voltage obtained by adding a voltage generated by the fourth current flowing in the fourth resistance element and a base-emitter voltage of the first bipolar transistor becomes a power-supply voltage, and
    wherein the power-on reset circuit is configured so that an output of the comparator is reversed when the first current and the third current are equal to each other.

2. The semiconductor device according to claim 1, further comprising:
    a PMOS transistor outputting a high level of the power-on reset circuit, the output terminal of the comparator being connected to a gate of the PMOS transistor; and
    a fifth resistance element connected to a drain of the PMOS transistor and outputting a low level of the power-on reset circuit.

3. The semiconductor device according to claim 1, wherein the fourth resistance element is connected to a power supply, and is connected to the first resistance element in series.

4. The semiconductor device according to claim 1, further comprising an internal circuit receiving an output of the power-on reset circuit.

5. A semiconductor device having a power-on reset circuit, the power-on reset circuit comprising:
- a first node supplying a reference voltage;
- a second node, a power-supply voltage is applied between the first node and the second node;
- a fourth resistance element, a first resistance element, and a first bipolar transistor connected in series between the second node and the first node;
- a third node connecting the fourth resistance element and the first resistance element;
- a fourth node connecting the first resistance element and a collector of the first bipolar transistor;
- a second resistance element has one end connected to the third node and a base of the first bipolar transistor, and the other end connected to an emitter of the first bipolar transistor;
- a third resistance element and a second bipolar transistor connected in series between the third node and the first node;
- a fifth node connecting the third resistance and a collector of the second bipolar transistor; and
- a comparator having a non-inverting input terminal connecting the fourth node and an inverting input terminal connecting the fifth node,
wherein the second bipolar transistor is configured so that N bipolar transistors are connected in parallel.

6. The semiconductor device according to claim 5, further comprising a PMOS transistor and a fifth resistance element connected in series between the second node and the first node,
wherein a source of the PMOS transistor is connected to the second node, and a gate thereof is connected to an output terminal of the comparator, and
wherein one end of the fifth resistance element is connected to the first node, and the other end thereof is connected to a drain of the PMOS transistor.

7. The semiconductor device according to claim 5, further comprising a sixth resistance element having one end connecting the first node, and the other end connected to an emitter of the first bipolar transistor and an emitter of the second bipolar transistor.

8. The semiconductor device according to claim 5, further comprising an internal circuit receiving an output of the power-on reset circuit.

* * * * *